US012757464B2

(12) United States Patent
Yuan

(10) Patent No.: US 12,757,464 B2
(45) Date of Patent: Oct. 6, 2026

(54) SILICON CARBIDE SEMICONDUCTOR DEVICE AND MANUFACTURING METHOD THEREFOR

(71) Applicant: HUBEI JIUFENGSHAN LABORATORY, Wuhan (CN)

(72) Inventor: Jun Yuan, Wuhan (CN)

(73) Assignee: HUBEI JIUFENGSHAN LABORATORY, Wuhan (CN)

( * ) Notice: Subject to any disclaimer, the term of this patent is extended or adjusted under 35 U.S.C. 154(b) by 360 days.

(21) Appl. No.: 18/426,392

(22) Filed: Jan. 30, 2024

(65) Prior Publication Data

US 2024/0170540 A1 May 23, 2024

Related U.S. Application Data

(63) Continuation of application No. PCT/CN2022/125793, filed on Oct. 18, 2022.

(30) Foreign Application Priority Data

Nov. 17, 2021 (CN) ......................... 202111363503.1
Nov. 17, 2021 (CN) ......................... 202122827400.8

(51) Int. Cl.
*H01L 29/16* (2006.01)
*H01L 29/66* (2006.01)
*H10D 12/01* (2025.01)
*H10D 62/832* (2025.01)

(52) U.S. Cl.
CPC ....... *H10D 62/8325* (2025.01); *H10D 12/031* (2025.01)

(58) Field of Classification Search
CPC ............. H10D 30/021; H10D 30/0297; H10D 30/668; H10D 12/031; H10D 62/157; H10D 62/159; H10D 62/393; H10D 62/8325
See application file for complete search history.

(56) References Cited

U.S. PATENT DOCUMENTS

2018/0366569 A1* 12/2018 Zeng .................... H10D 12/031
2020/0212183 A1* 7/2020 Utsumi ................ H10D 12/031
2021/0005744 A1* 1/2021 Ebihara ................ H10D 12/031
2021/0384298 A1* 12/2021 Hoshi .................. H10D 30/668

FOREIGN PATENT DOCUMENTS

CN 105453220 A 3/2016
CN 106575610 A 4/2017
CN 106796956 A 5/2017

* cited by examiner

*Primary Examiner* — David C Spalla
(74) *Attorney, Agent, or Firm* — Nitin Kaushik

(57) ABSTRACT

The present application discloses a silicon carbide semiconductor device and a manufacturing method therefor. An epitaxial wafer comprises a semiconductor substrate; a first epitaxial layer provided on the surface of the semiconductor substrate; al second epitaxial layer provided on the surface of the side of the first epitaxial layer facing away from the semiconductor substrate; and a third epitaxial layer provided on the surface of the side of the second epitaxial layer facing away from the first epitaxial layer. A gate is formed by means of a trench formed in the third epitaxial layer, and ion implantation can also be performed in the second epitaxial layer on the basis of the trench before the gate is formed, such that a doped region inverted with the second epitaxial layer is formed in the second epitaxial layer.

4 Claims, 14 Drawing Sheets

SILICON CARBIDE SEMICONDUCTOR DEVICE AND MANUFACTURING METHOD THEREFOR

CROSS-REFERENCES TO RELATED APPLICATIONS

The present application claims priority to Chinese Patent Application No. 202111363503.1 filed to China National Intellectual Property Administration (CNIPA) on Nov. 17, 2021 and entitled "SILICON CARBIDE SEMICONDUCTOR DEVICE AND MANUFACTURING METHOD THEREFOR", the contents of which are incorporated herein by reference in its entirety.

The present application claims priority to Chinese Patent Application No. 202122827400.8, filed to China National Intellectual Property Administration (CNIPA) on Nov. 17, 2021 and entitled "SILICON CARBIDE SEMICONDUCTOR DEVICE", the contents of which are hereby incorporated herein by reference in its entirety.

TECHNICAL FIELD

The present application relates to the technical field of semiconductor devices, and in particular to a silicon carbide (SiC) semiconductor device and a manufacturing method there for.

BACKGROUND

With the continuous development of science and technology, more and more electronic devices are widely applied to people's daily life and work, bring great convenience to people's daily life and work, and become indispensable tools for people today.

The main structures of the electronic devices to achieve various functions are integrated circuits, and semiconductor devices are important constituent electronic components of the integrated circuits. Silicon carbide semiconductor devices have become a main development direction in the field of semiconductors due to their excellent characteristics of the silicon carbide semiconductors in the high-power application field.

Due to the characteristics of a silicon carbide material, in a case that doping with a large injection depth is to be realized, high-energy ion injection will lead to its lattice damage, so in an existing manufacturing method, when a silicon carbide semiconductor device with a larger-depth doping region is manufactured, it is necessary to form a required doping region in the firstly-formed epitaxial layer through etching and ion injection and then form a subsequent epitaxial layer in the manufacturing process of an epitaxial wafer.

SUMMARY

In view of this, the present application provides a silicon carbide semiconductor device and a manufacturing method therefor. The solution is as follows:

a manufacturing method for a silicon carbide semiconductor device, includes:

providing an epitaxial wafer, where the epitaxial wafer includes: a semiconductor substrate, a first epitaxial layer arranged on a surface of the semiconductor substrate, a second epitaxial layer arranged on a surface of one side of the first epitaxial layer that is away from the semiconductor substrate, and a third epitaxial layer arranged on a surface of one side of the second epitaxial layer that is away from the first epitaxial layer;

forming a well region, a source region and a groove in the third epitaxial layer;

performing ion injection in the second epitaxial layer based on the groove to form a doping region inverted from the second epitaxial layer, wherein the doping region penetrates through the second epitaxial layer; and forming a gate electrode in the groove.

Preferably, in the above manufacturing method, the second epitaxial layer has a to-be-injected region and a first layer of well region surrounding the to-be-injected region.

Forming a well region, a source region and a groove in the third epitaxial layer includes:

sequentially forming a second layer of well region, a third layer of well region and the source region in the third epitaxial layer through ion injection, where the second layer of well region is located between the first layer of well region and the third layer of well region, and the source region is located on one side of the third layer of well region that is away from the second layer of well region; and forming the groove in a surface of one side of the third epitaxial layer that is away from the second epitaxial layer, where the bottom of the groove is located between the second epitaxial layer and the third layer of well region, the source region and the third layer of well region are both in contact with a side wall of the groove, and there is a distance between the second layer of well region and the side wall of the groove.

Preferably, in the above manufacturing method, a manufacturing method for the epitaxial wafer includes:

sequentially performing epitaxy on the surface of the semiconductor substrate to form the first epitaxial layer, the second epitaxial layer and the third epitaxial layer, wherein the first epitaxial layer has the same doping type as the third epitaxial layer, and the first epitaxial layer and the second epitaxial layer perform inversed doping.

Preferably, the above manufacturing method further includes:

forming a metal source electrode connected to the source region; and forming a metal drain electrode on a surface of one side of the semiconductor substrate that is away from the first epitaxial layer.

The present application further provides a silicon carbide semiconductor device prepared according to the above manufacturing method, including:

an epitaxial wafer, where the epitaxial wafer includes: a semiconductor substrate, a first epitaxial layer arranged on a surface of the semiconductor substrate, a second epitaxial layer arranged on a surface of one side of the first epitaxial layer that is away from the semiconductor substrate, and a third epitaxial layer arranged on a surface of one side of the second epitaxial layer that is away from the first epitaxial layer;

a well region, a source region and a groove which are arranged in the third epitaxial layer;

a doping region penetrating through the second epitaxial layer, where the doping region and the second epitaxial layer perform inversed doping, and the doping region is formed based on the groove through ion injection; and a gate electrode arranged in the groove.

Preferably, in the above silicon carbide semiconductor device, the second epitaxial layer has a to-be-injected region and a first layer of well region surrounding the to-be-injected region; a second layer of well region, a third layer of well region and the source region are arranged in the third epitaxial layer; the second layer of well region is located between the first layer of well region and the third layer of well region; the source region is located on one side of the third layer of well region that is away from the second layer of well region; the source region and the third layer of well region are both in contact with a side wall of the groove; there is a distance between the second layer of well region and the side wall of the groove; the groove is located in a surface of one side of the third epitaxial layer that is away from the semiconductor substrate; the bottom of the groove is located between the second epitaxial layer and the third layer of well region;

a thickness of the third epitaxial layer does not exceed 1 m; and a distance between the bottom of the groove and the first epitaxial layer is less than 1 m.

Preferably, in the above silicon carbide semiconductor device, a width of the groove meets a uniform condition in a direction that the bottom of the groove points to an opening.

Preferably, in the above silicon carbide semiconductor device, a width of the groove is gradually increased in a direction that the bottom of the groove points to an opening.

Preferably, in the above silicon carbide semiconductor device, a width of the doping region is not less than a width of the groove.

Preferably, in the above silicon carbide semiconductor device, the doping region, the first epitaxial layer and the third epitaxial layer have the same doping type; and a doping concentration of the doping region is greater than a doping concentration of the first epitaxial layer and a doping concentration of the third epitaxial layer.

It can be seen from the above description that in the silicon carbide semiconductor device and the manufacturing method therefor provided by the technical solution of the present application, the epitaxial wafer includes: a semiconductor substrate, a first epitaxial layer arranged on a surface of the semiconductor substrate, a second epitaxial layer arranged on a surface of one side of the first epitaxial layer that is away from the semiconductor substrate, and a third epitaxial layer arranged on a surface of one side of the second epitaxial layer that is away from the first epitaxial layer. A gate electrode is formed by the groove formed on the third epitaxial layer, and ion injection can be performed in the second epitaxial layer based on the groove before the gate electrode is formed, so that the doping region inverted from the second epitaxial layer is formed in the second epitaxial layer, and the problem that the silicon carbide semiconductor power device is inconvenient to form the doping region with a larger depth is solved.

BRIEF DESCRIPTION OF THE DRAWINGS

To describe the technical solutions in the embodiments of the present application or in the prior art more clearly, the following briefly describes the accompanying drawings required for describing the embodiments or the prior art. Apparently, the accompanying drawings in the following description show only some embodiments of the present invention, and those of ordinary skill in the art may still derive other accompanying drawings from these accompanying drawings without creative efforts.

The structure, scale, size and the like shown in the drawings of the specification are only used to cooperatively describe the content disclosed by the specification for those skilled in the art to understand and read, and are not limiting conditions used for limiting the implementation of the present application. Therefore, it has no technical substantive significance. Any structural modification, change of a scale relationship or adjustment of size should still fall within the scope which can be covered by the technical content disclosed by the present application without affecting the effects generated by the present application and objectives achieved by the present application.

DETAILED DESCRIPTION OF THE EMBODIMENTS

The embodiments of the present application are described clearly and completely below with reference to the accompanying drawings in the embodiments of the present application. Apparently, the described embodiments are merely some of the embodiments of the present invention, not all of the embodiments. All other embodiments obtained by those of ordinary skill in the art based on the embodiments of the present application without creative efforts shall fall within the scope of protection of the present application.

Due to the excellent characteristics of the SiC material, the SiC material has a strong attraction in the high power aspect, and becomes one of the ideal materials for a high-performance power MOSFET. SiC vertical power MOSFET devices mainly include a transverse type double-diffusion DMOSFET and a UMOSFET with a vertical gate groove structure.

Figure 1:
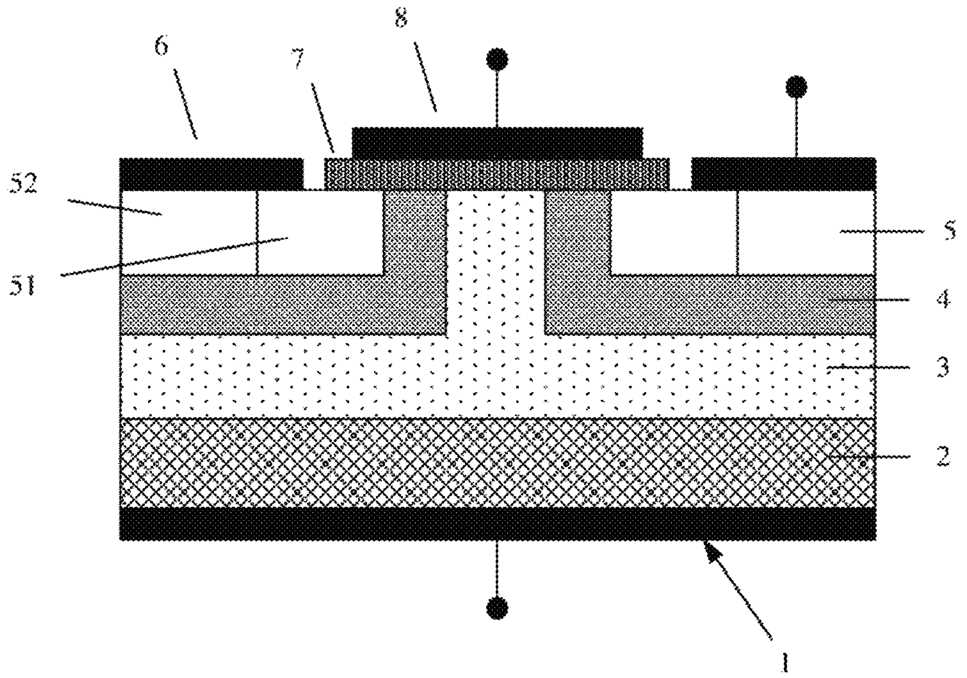
FIG. 1 is a structural schematic diagram of a DMOSFET.

As shown in FIG. 1, FIG. 1 is a structural schematic diagram of a DMOSFET, including: an n+ (n type heavy doping) substrate 2; an n− (n type light doping) drift region 3 arranged on a surface of the substrate 2; a p type well region 4 located in the drift region 3; and a source region 5 located in the p type well region, where the source region 5 includes an n+ doping region 51 and a p+ (p type heavy doping) doping region 52. A gate electrode dielectric layer 7 is arranged on a surface of the drift region 3, and a gate electrode 8 is arranged on a surface of the gate electrode dielectric layer 7. A drain electrode 1 is arranged on a surface of one side of the substrate 2 that is away from the drift region 3.

The DMOSFET structure adopts a planar diffusion technology, adopts a refractory material, such as a polycrystalline silicon gate as a mask, and uses the edge of the polycrystalline silicon gate to define a p base region and an n+ source region. The name of DMOS is derived from such double-diffusion process. A surface channel region is formed by the side diffusion difference between the p type base region and the n+ source region.

Figure 2:
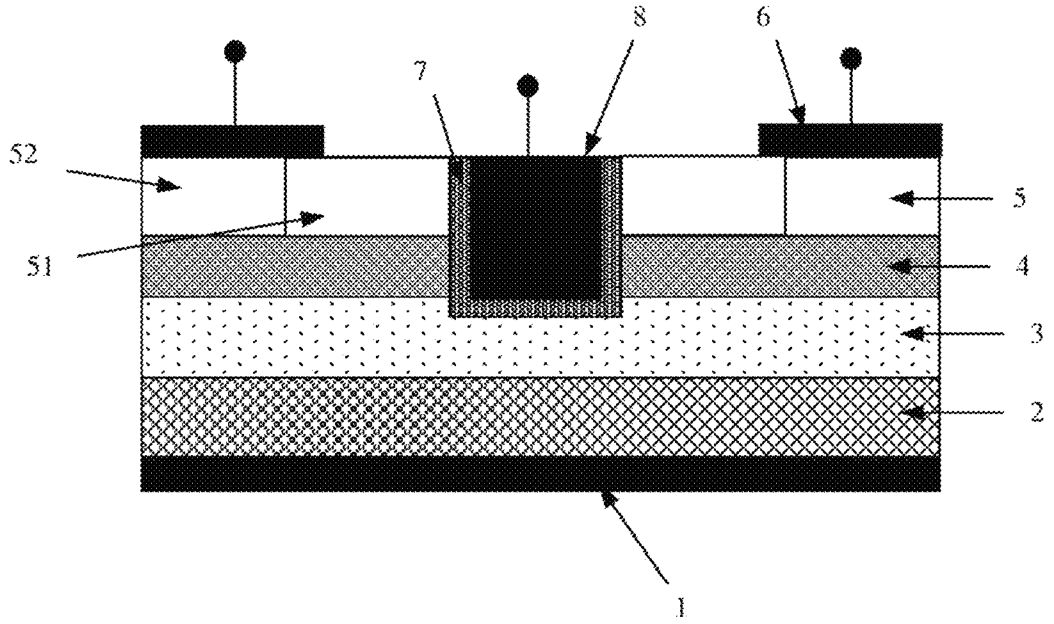
FIG. 2 is a structural schematic diagram of a UMOSFET.

As shown in FIG. 2, FIG. 2 is a structural schematic diagram of a UMOSFET, different from the structure shown in FIG. 1, a U-shaped groove is arranged in the UMOSFET, a surface of the U-shaped groove is covered with the gate electrode dielectric layer 7, and the gate electrode 8 is filled into the U-shaped groove. The name of the UMOSFET with the vertical gate groove structure is derived from a U-shaped groove structure. The U-shaped groove structure is formed in the gate region through reactive ion etching. The U-shaped groove structure has higher channel density (the channel density is defined as an active region channel width), which enables the on-state characteristic resistance of the device to be significantly reduced.

After years of research on the planar SiC MOSFET in the industry, some manufacturers have taken the lead in launching commercial products. For an ordinary transverse type DMOSFET structure, the progress of the modern technology has reached the point where the size of an MOS cell can be reduced while the on-resistance cannot be reduced. The main reason is the limitation of the resistance of a JFET neck region, the on-resistance per unit area is also difficult to be reduced to 2 mΩ-cm$^2$ even if a smaller photoetching size is adopted. However, the groove structure can effectively solve the problem. The U-shaped groove structure is shown in FIG. 2 and adopts a groove etching technology in each process of manufacturing storing capacitance in a memory, so that a conductive groove is changed from a transverse direction to a longitudinal direction. Compared with an ordinary structure, the JEFT neck resistance is eliminated, the cell density is greatly increased, and the current processing capability of a power semiconductor is improved.

However, there are still several problems in the actual process manufacturing and application of SiC UMOSFET:

a high electric field of a SiC drift region leads to a very high electric field on a gate electrode dielectric layer. This problem is aggravated at a groove corner, thereby leading to the rapid breakdown of the gate electrode dielectric layer under a high drain electrode voltage. The tolerance to the electrostatic effect in the harsh environment and a high voltage spike in a circuit is low.

Figure 3:
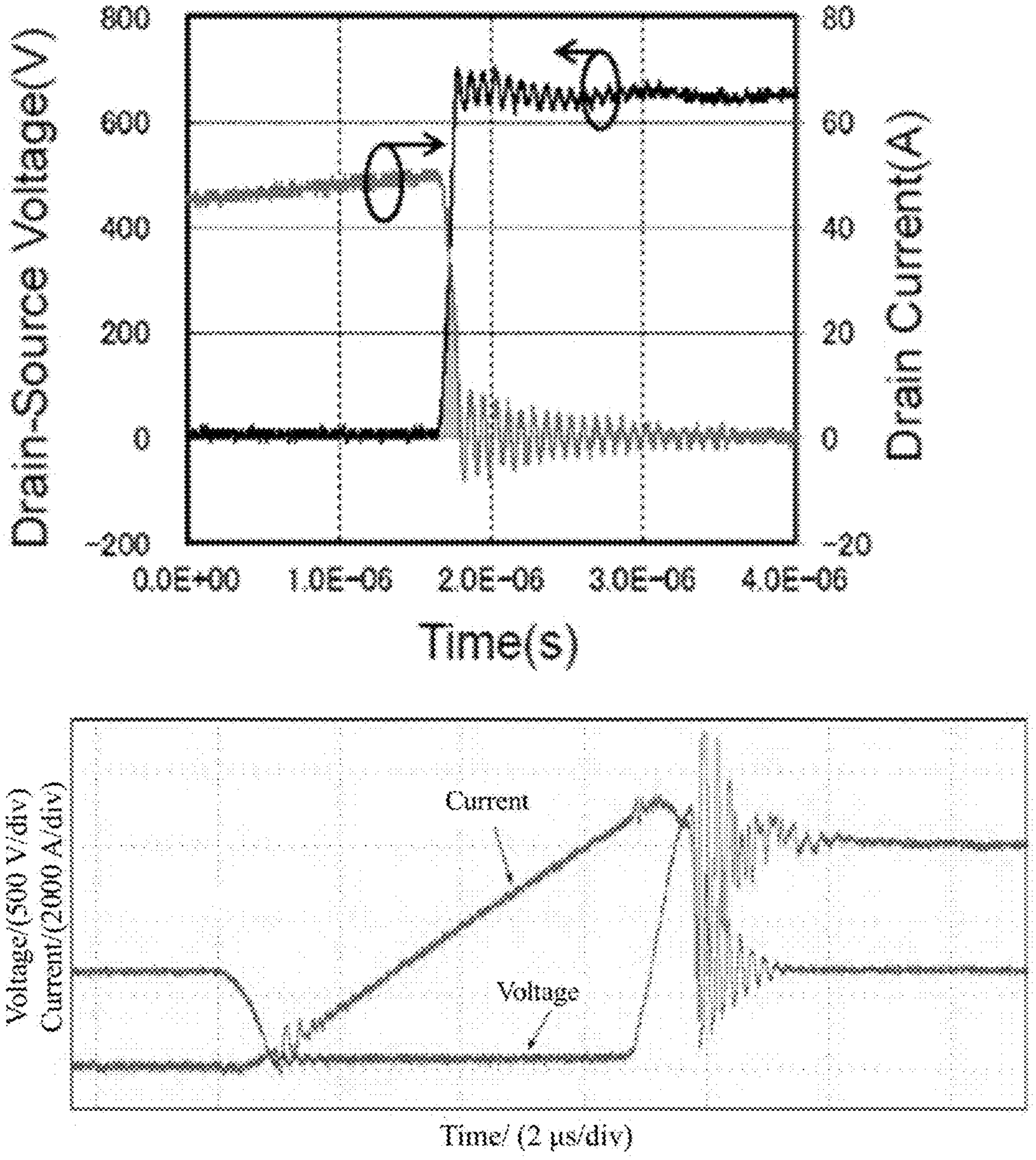
FIG. 3 is an oscillogram of a voltage overshoot and oscillation phenomenon at the on-off moment of an MOSFET.

Since the SiC power MOSFET is mainly applied in the field of high voltage, high frequency and high current, a parasitic parameter in the circuit will generate spikes and burrs in the high-frequency on-off process. As shown in FIG. 3, FIG. 3 is an oscillogram of a voltage overshoot and oscillation phenomenon at the on-off moment of an MOSFET. It can be seen based on FIG. 3 that the instantaneous overvoltage on the current path of the device increases the loss in the on-off process at the same time; or a high surge voltage is formed due to the change in power load, so the surge voltage resistance and the overvoltage protection of the MOSFET are also very important.

Since the conventional MOSFET device does not have the surge-voltage-resistant self-suppression ability and the overvoltage protection ability itself, it is often necessary to design a complicated buffer circuit, a surge voltage suppression circuit and an overvoltage protection circuit in the actual application. The external matched suppression and overvoltage protection circuit often has time delay, the high-frequency spike voltage surge in the actual on-off process is still borne by the device, so that the breakdown failure of the device channel region and the gradual failure of the gate structure and the electrode ohm contact region are caused sometimes, resulting in the reliability problem of the device.

Due to the limited depth of ion injection, it is difficult to realize many targeted groove gate electrode protection structures and anti-surge design in process. The depth of the groove generally used for forming the gate electrode is above 1 μm to 2 μm. Since the gate electrode structure in the groove is to be protected, the actual manufacturing process of the buried protection structure cannot be directly implemented through ion injection, which is because in the silicon carbide process, the depth of the ion injection is difficult to exceed 1 μm. In the prior art, the required doping region is generally formed in the firstly-formed epitaxial layer through etching and ion injection, and then two p type epitaxial layers with a specific structure is formed, resulting in the complicated manufacturing process and higher manufacturing cost.

To make the above objectives, features and advantages of the present application more obvious and easy to understand, the present application will be further described in detail with reference to the accompanying drawings and the specific implementation.

Figure 4:
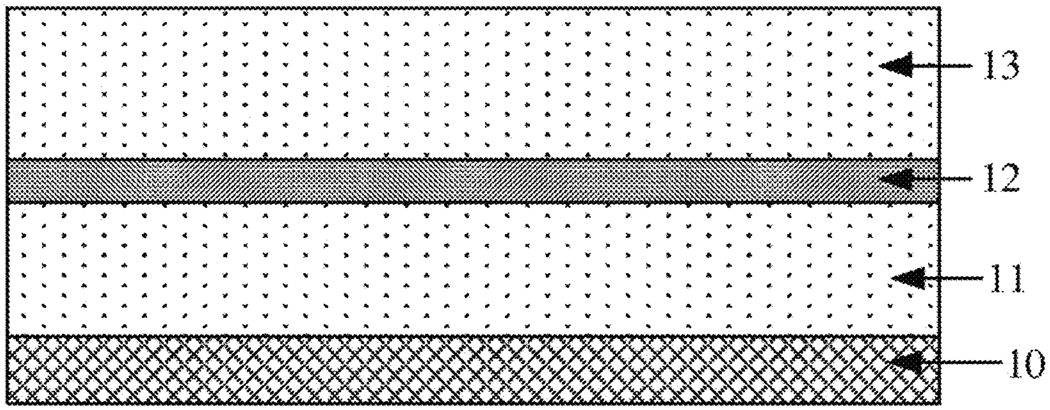
FIG. 4-FIG. 10 are process flowcharts of a manufacturing method for a silicon carbide semiconductor device provided by an embodiment of the present application.

As shown in FIG. 4-FIG. 10, FIG. 4-FIG. 10 are process flowcharts of a manufacturing method for a silicon carbide semiconductor device provided by an embodiment of the present application. The manufacturing method includes:

Step S11: as shown in FIG. 4, an epitaxial wafer is provided, where the epitaxial wafer includes: a semiconductor substrate 10, a first epitaxial layer 11 arranged on a surface of the semiconductor substrate 10, a second epitaxial layer 12 arranged on a surface of one side of the first epitaxial layer 11 that is away from the semiconductor substrate 10, and a third epitaxial layer 13 arranged on a surface of one side of the second epitaxial layer 12 that is away from the first epitaxial layer 11, where the epitaxial wafer is a silicon carbide epitaxial wafer. The semiconductor substrate 10 and each epitaxial layer on the surface of the semiconductor substrate are all made of a silicon carbide material.

Step S12: as shown in FIG. 5-FIG. 8, a well region, a source region 15 and a groove 20 are formed in the third epitaxial layer 13.

Figure 9:
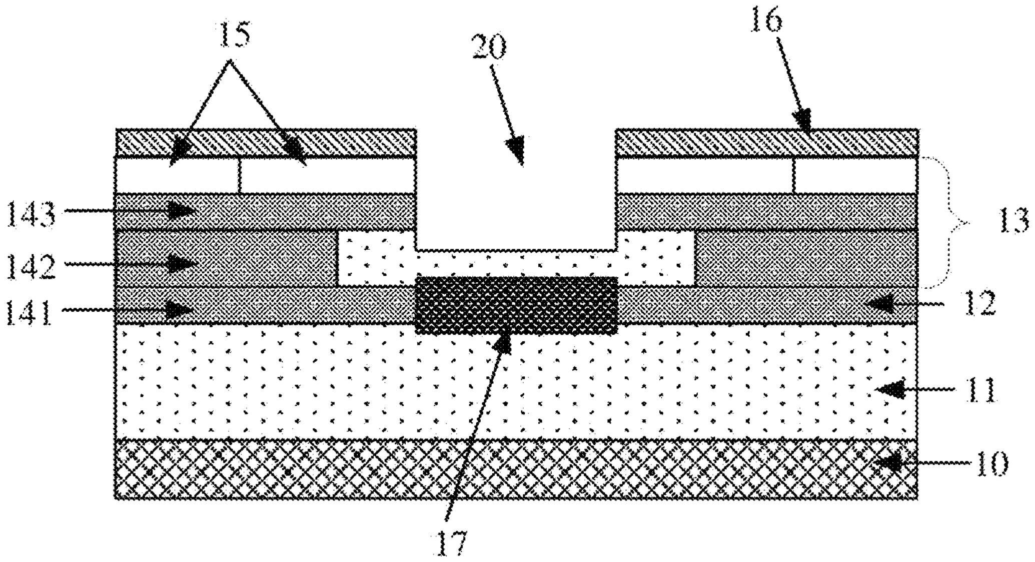

Step S13: as shown in FIG. 9, ion injection is performed in the second epitaxial layer 12 based on the groove 20 to form a doping region 17 inverted from the second epitaxial layer 12; and the doping region 17 penetrates through the second epitaxial layer 12.

Figure 10:
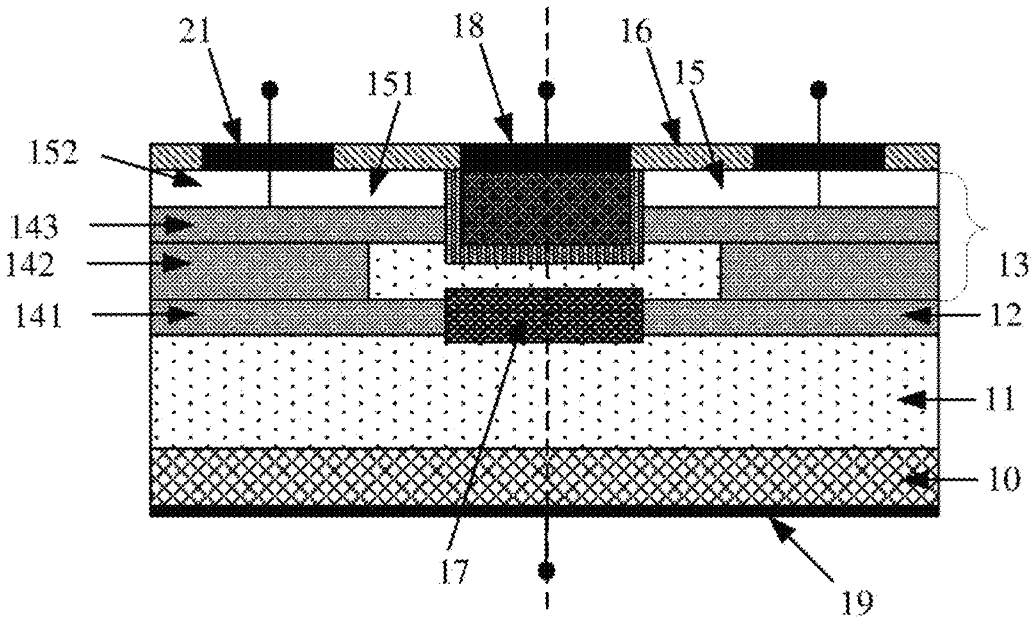

Step S14: as shown in FIG. 10, a gate electrode 18 is formed in the groove 20, where FIG. 10 only shows one cell structure of a semiconductor device. The semiconductor device may be a silicon carbide MOSFET device. In an actual product, the semiconductor device may have a plurality of cell structures. The number and layout manner of cells may be set according to requirements, which is not specifically limited by the embodiment of the present application.

In the manufacturing method of the embodiment of the present application, a manufacturing method for the epitaxial wafer includes: sequentially performing epitaxy on a surface of the semiconductor substrate 10 to form the first epitaxial layer 11, the second epitaxial layer 12 and the third epitaxial layer 13, where the first epitaxial layer 11 has the same doping type as the third epitaxial layer 13, and the first epitaxial layer and the second epitaxial layer 12 perform inversed doping.

The semiconductor substrate 10 may be set as an n+ type doped silicon carbide substrate, the first epitaxial layer 11 and the third epitaxial layer 13 are both n− type doped silicon carbide epitaxial layers, and the second epitaxial layer 12 is a p type doped silicon carbide epitaxial layer. Therefore, the p type doped second epitaxial layer 12 is a buried layer, the epitaxial wafer with the buried layer is cleverly adopted, and the groove 20 required by the gate electrode 8 is used for ion injection to form the doping region 17, so that the difficulties of the shielding of the groove gate electrode structure and the injection process of the silicon carbide material are solved. Furthermore, the doping region 17 may form a modulable JFET structure in a current path of the device, the resistance and the self-locking protective effect of the device are automatically adjusted, and meanwhile, a smaller device cell size is realized.

In the semiconductor device, the well region structure includes: a first layer of well region 141, a second layer of well region 142 and a third layer of well region 143. The second epitaxial layer 12 has a to-be-injected region and the first layer of well region 141 surrounding the to-be-injected region; and the to-be-injected region is used for forming the doping region 17.

Figure 5:
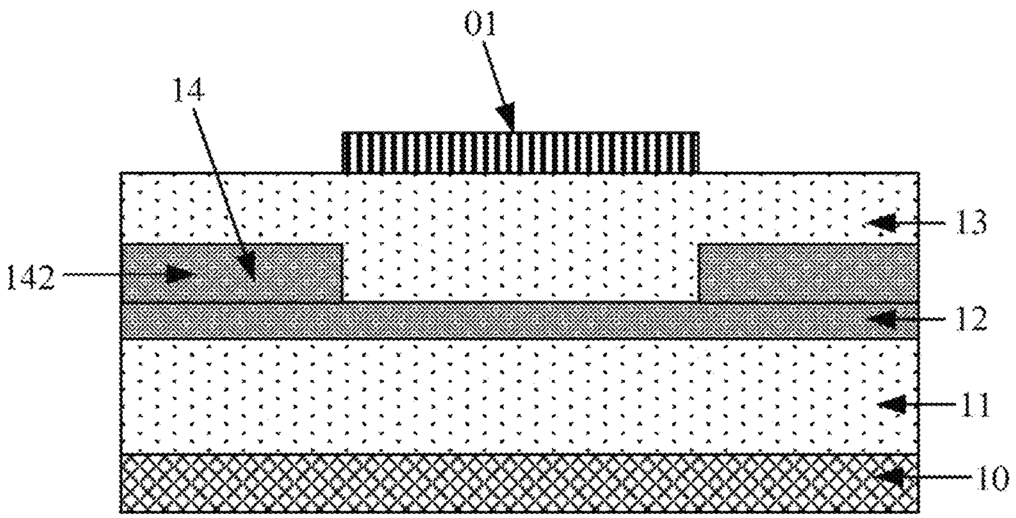
Figure 6:
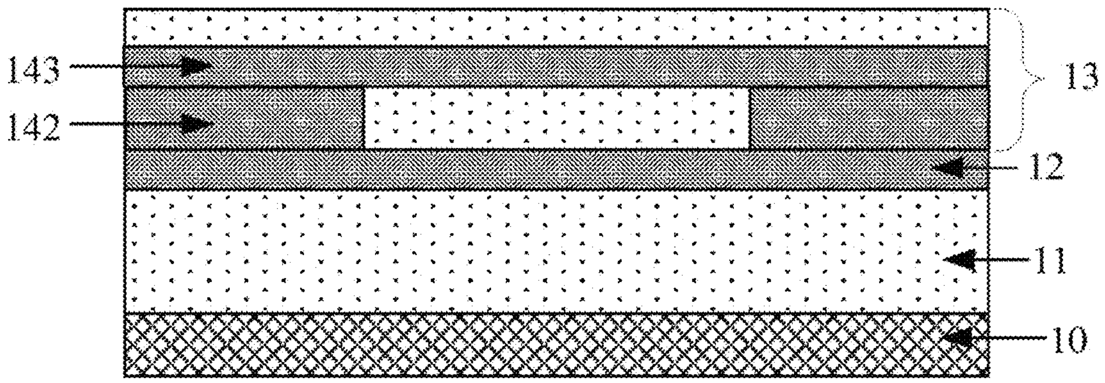
Figure 7:
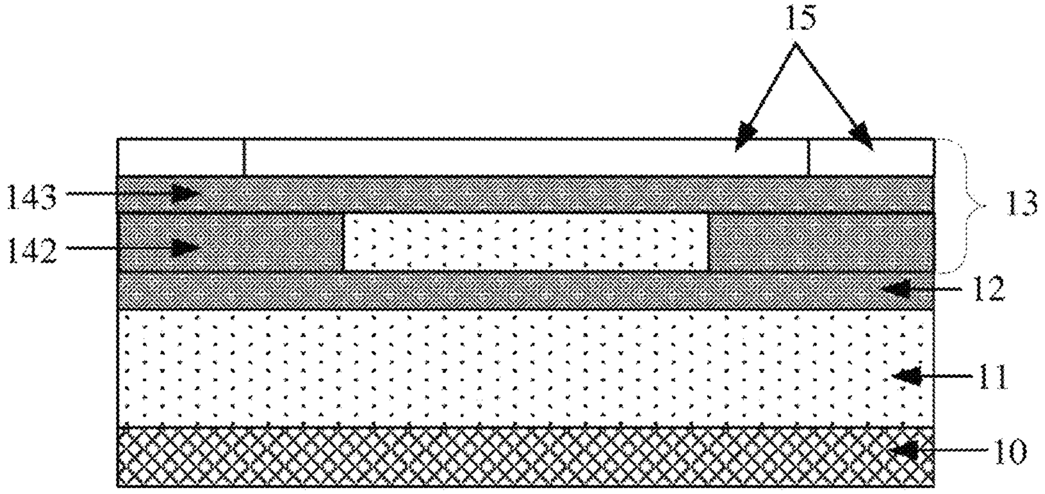

In Step S12, forming a well region, a source region 15 and a groove 20 in the third epitaxial layer 13 includes:

firstly, as shown in FIG. 5-FIG. 7, the second layer of well region 142, the third layer of well region 143 and the source region 15 are sequentially formed in the third epitaxial layer 13 through ion injection. The second layer of well region 142 is located between the first layer of well region 141 and the third layer of well region 143. The source region 15 is located on one side of the third layer of well region 143 that is away from the second layer of well region 142.

Specifically, as shown in FIG. 5, ion injection is performed based on a mask layer 01, the second layer of well region 142 is formed in the third epitaxial layer 13, and the second layer of well region 142 surrounds a non-injection region. The required non-injection region is formed based on the graphical mask layer 01. Vertical projections of the groove 20 and the doping region 17 both fall within in the non-injection region. Furthermore, the groove and the doping region have a distance from the non-injection region in a direction parallel to the epitaxial wafer (that is, a horizontal direction in FIG. 5-FIG. 8). Further, as shown in FIG. 6, the third layer of well region 143 is formed on the second layer of well region 142 through ion injection again, and the third layer of well region 143 covers the second layer of well region 142 and the non-injection region surrounded by the second layer of well region. Further, as shown in FIG. 7, the source region 15 is formed on the third layer of well region 143 through ion injection again.

Figure 8:
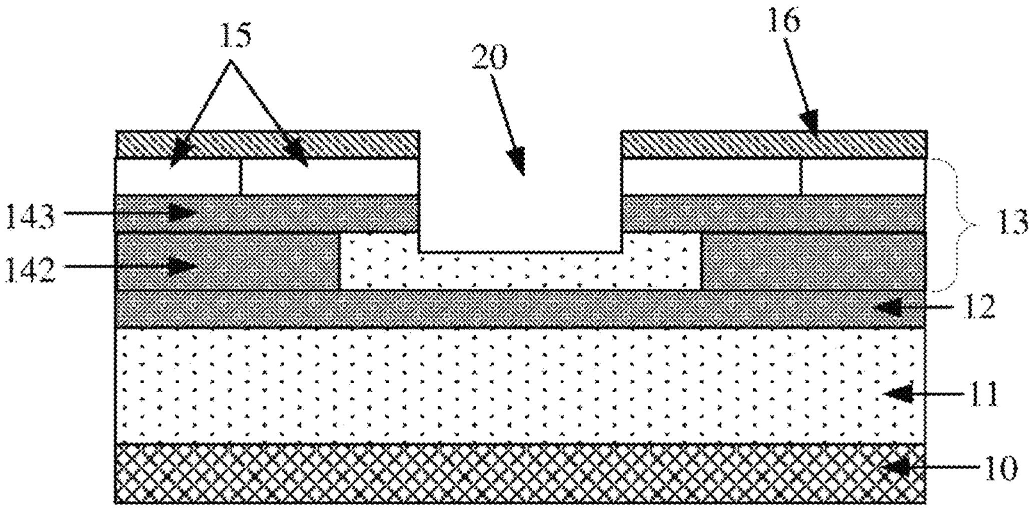

Then, as shown in FIG. 8, the groove 20 is formed on a surface of one side of the third epitaxial layer 13 that is away from the second epitaxial layer 12; and the bottom of the groove 20 is located between the second epitaxial layer 12 and the third layer of well region 143, where the source region 15 and the third layer of well region 143 are both in contact with a side wall of the groove 20. When the source region 15 is formed through ion injection, the ion injection region covers a region for forming the groove 20, so after the groove is formed subsequently, the source region 15 that has not been removed is directly in contact with the side wall of the groove 20. Similarly, when the third layer of well region 143 is formed, the ion injection region covers the region for forming the groove 20, so after the groove is formed subsequently, the third layer of well region 143 that has not been removed is directly in contact with the side wall of the groove 20.

The second layer of well region 142 and the side wall of the groove 20 have a distance. The size of the non-injection region surrounded by the second layer of well region 142 is greater than the size of the groove 20, the vertical projection of the groove 20 is set to fall within the non-injection region, and there is a distance between the groove and the non-injection region, so that the second layer of well region 142 is not in contact with the side wall of the groove 20, and there is a distance between the second layer of well region and the groove.

As shown in FIG. 10, the manufacturing method further includes:

a metal source electrode 21 connected to the source region 15 is formed; and a metal drain electrode 19 is formed on a surface of one side of the semiconductor substrate 10 that is away from the first epitaxial layer 11.

The source region 15 includes a first region 151 and a second region 152 with opposite doping types, and the source region 15 is in contact with both the first region 151 and the second region 152. The first region 151 may be set as an n+ type doping region, and the second region 152 may be set as a p+ type doping region.

In the silicon carbide semiconductor device formed according to the manufacturing method of the embodiment of the present application, the well region structure comprises three layers, namely, the first layer of well region 141, the second layer of well region 142 and the third layer of well region 143. The third layer of well region 143 on the uppermost layer is located on a left side and a right side of the groove 20, and is in contact with the side wall of the groove 20. The second layer of well region 142 on the middle layer includes two parts located on the left side and the right side of the groove 20, and is not in contact with the side wall of the groove 20. The first layer of well region 141 on the lowermost layer is located below the groove 20, and is not in contact with the groove 20.

A distance between the left and right parts of the second layer of well region 142 and a vertical central axis of the cell structure is greater than a distance between the left and right parts of the first layer of well region 141 and the vertical central axis of the cell structure. Specifically, the vertical central axis of the cell structure is the central axis of the groove 20, as shown in a dotted line in FIG. 10, and relative to the second layer of well region 142, the first layer of well region 141 is closer to the central axis.

A specific JFET structure may be formed on a current path between the source electrode and the drain electrode through the doping region 17. The conduction characteristic of the JFET structure may be optimized and adjusted through the graphic design of the doping region 17 and the ion injection concentration as well as the graphic outline, thereby improving the performance of the semiconductor device.

According to the technical solution of the present application, the second epitaxial layer 12 and the doping region 17 penetrating through the second epitaxial layer 12 are involved in the epitaxial wafer cleverly, so that the difficulties of the shielding of the SiC groove MOSFET gate-oxide structure and the deep injection process in the silicon carbide material are solved. Meanwhile, the doping region 17 can introduce the JFET structure modulated by ion injection on the current path of the device, the on-resistance and the self-locking protective effect of the device are automatically adjusted, and meanwhile, a small cell size of the device is realized.

It can be seen from the above description that the silicon carbide semiconductor device formed according to the manufacturing method of the embodiment of the present application at least has the following beneficial effects:

the silicon carbide semiconductor device can introduce a JFET structure on the current path of the cell structure, the on-resistance and the self-locking protective effect of the device are automatically adjusted, and meanwhile, a small cell size of the device is realized. Furthermore, the conduction characteristic of the JFET structure is optimized and adjusted through the graphic design of the doping region 17 and the ion injection concentration as well as the graphic outline, the design and the process are flexible, and better manufacturability is achieved.

By using the epitaxial wafer with the buried layer (the second epitaxial layer 12) and the JFET structure modulated by injection of the doping region 17, depletion regions on two sides can be automatically expanded under a high surge voltage, so that the on-resistance of the JFET structure is increased, which is equivalent to a buffer circuit structure suppressing a surge spike by itself, meanwhile, when the surge voltage is excessively high, the depletion regions on two sides are continuously expanded and mutually overlapped to play a blocking effect, protect the gate electrode dielectric layer on the surface of the groove inside and play a certain role in overvoltage protection of the spike voltage.

Although the introduction of the JFET structure will increase the on-resistance, the on-off buffer and surge voltage self-suppression effects are achieved.

The silicon carbide semiconductor device can improve the self-suppression resistance of the device on the surge voltage and the overvoltage, thereby avoiding the damage to the device and the reduction of the reliability caused by the delay of the overvoltage protection circuit and the over current protection circuit in the actual effect.

Meanwhile, the spike jitter in the circuit on-off process is buffered, and the on-off loss is reduced; and the buffering circuit and the buffer circuit structures in the circuit design can be reduced, and discrete components can be reduced, so that the cost is reduced, the actual module voltage is also reduced, and the reliability is enhanced.

Based on the above embodiment, another embodiment of the present application further provides a silicon carbide semiconductor device. The silicon carbide semiconductor device can be prepared by adopting the manufacturing method according to the above embodiment. The structure of the silicon carbide semiconductor device may be shown in FIG. 10, including:

- an epitaxial wafer, where the epitaxial wafer includes: a semiconductor substrate 10, a first epitaxial layer 11 arranged on a surface of the semiconductor substrate 10, a second epitaxial layer 12 arranged on a surface of one side of the first epitaxial layer 11 that is away from the semiconductor substrate 10, and a third epitaxial layer 13 arranged on a surface of one side of the second epitaxial layer 12 that is away from the first epitaxial layer 11;
- a well region, a source region 15 and a groove which are arranged in the third epitaxial layer;
- a doping region 17 penetrating through the second epitaxial layer 12, where the doping region 17 and the second epitaxial layer perform inversed doping, and the doping region is formed based on the groove through ion injection; and a gate electrode 18 arranged in the groove. The gate electrode 18 includes a filling medium for filling the groove, and a metal gate electrode located on a surface of the filling medium. A gate electrode dielectric layer is arranged on the surface of the groove. After the gate electrode dielectric layer is formed, the gate electrode 18 is formed in the groove. The filling medium may be polycrystalline silicon and the like. The doping region 17 is formed before the gate electrode dielectric layer is formed in the groove, wherein the second epitaxial layer 12 has a to-be-injected region and a first layer of well region 141 surrounding the to-be-injected region; a second layer of well region 142, a third layer of well region 143 and the source region 15 are arranged in the third epitaxial layer 13; the second layer of well region 142 is located between the first layer of well region 141 and the third layer of well region 143; the source region 15 is located on one side of the third layer of well region 143 that is away from the second layer of well region 142; the source region 15 and the third layer of well region 143 are both in contact with a side wall of the groove; the bottom of the groove is located between the second epitaxial layer 12 and the third layer of well region 143; and the second layer of well region 142 is located on two sides of the groove, and there is a distance between the second layer of well region and the side wall of the groove.

In the silicon carbide semiconductor device, a thickness of the third layer of epitaxial layer 13 does not exceed 1 μm. In this way, the ion injection depths of the second layer of well region 142 and the third layer of well region 143 do not exceed 1 μm, the second layer of well region 142 and the third layer of well region 143 can be formed in the third epitaxial layer 13 of the silicon carbide material through ion injection, and lattice damage is avoided.

In the embodiment of the present application, the distance between the bottom of the groove of the first epitaxial layer 11 is less than 1 μm, so that when ion injection is performed based on the groove to form the doping region 17, the ion injection depth of the doping region 17 is less than 1 μm, the doping region 17 can be formed in the second epitaxial layer 12 of the silicon carbide material through ion injection, and lattice damage is avoided. There is a non-zero distance between the doping region 17 and the bottom of the groove.

Optionally, a width of the groove meets a uniform condition in a direction that the bottom of the groove points to an opening (a direction from bottom to top in FIG. 10), namely, the width of the groove is the same or approximately the same in the direction, that is to say, the groove is a rectangular groove. Generally, the second epitaxial layer 12 is an epitaxial layer with a uniform thickness, the width of the groove is set to meet the uniform condition, and the doping region 17 with the uniform width in the direction can be formed conveniently.

Figure 11:
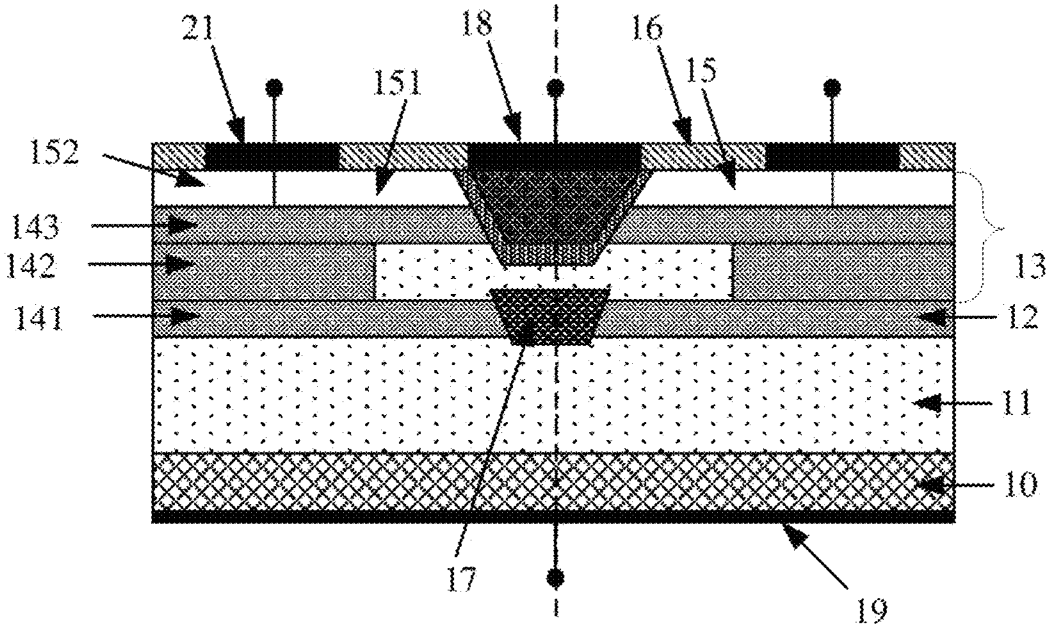
FIG. 11 is a structural schematic diagram of a silicon carbide semiconductor device provided by an embodiment of the present application.

In other manners, the structure of the electronic device may also be as shown in FIG. 11. FIG. 11 is a structural schematic diagram of a silicon carbide semiconductor device provided by an embodiment of the present application. The manner is different from the structure shown in FIG. 10 in that the width of the groove is gradually increased in a direction that the bottom of the groove points to an opening, that is, the groove is a V-shaped groove or an inverted trapezoidal groove. If the groove is the V-shaped groove, the doping region 17 is of a V-shaped structure. If the groove is the inverted trapezoidal groove, the doping region is of an inverted trapezoidal structure as shown in FIG. 11 when an ion injection window is larger than the bottom of the groove. If the ion injection window is not larger than the bottom of the groove, the doping region is of a rectangular structure.

In the embodiment of the present application, the width of the doping region 17 is not greater than the width of the groove, so that ion injection can be performed based on the groove to form the doping region 17, so as to reduce the ion injection depth. The doping region 17, the first epitaxial layer 11 and the third epitaxial layer 13 have the same doping type.

The silicon carbide semiconductor device is an NMOS. The semiconductor substrate 10 may be an n+ type substrate, the first epitaxial layer 11 and the third epitaxial layer 13 both adopt n− type doping, the second epitaxial layer 12 adopts p− type doping, and the doping region 17 adopts n type doping. In the embodiment of the present application, the relationship of the doping concentration is n+>n>n−, and p+>p>p−. n−, n and n+ adopt the same type of doping, belonging to the first type of doping. p−, p and p+ adopt the same type of doping, belonging to the second type of doping. The first type of doping and the second type of doping are inversed doping.

The silicon carbide semiconductor device may further be a PMOS. The doping type may be set based on requirements to form the NMOS or PMOS.

The doping concentration of the doping region 17 is greater than the doping concentration of the first epitaxial layer 11 and the doping concentration of the third epitaxial layer 13. The doping region 17 adopts n+ type doping.

Figure 12:
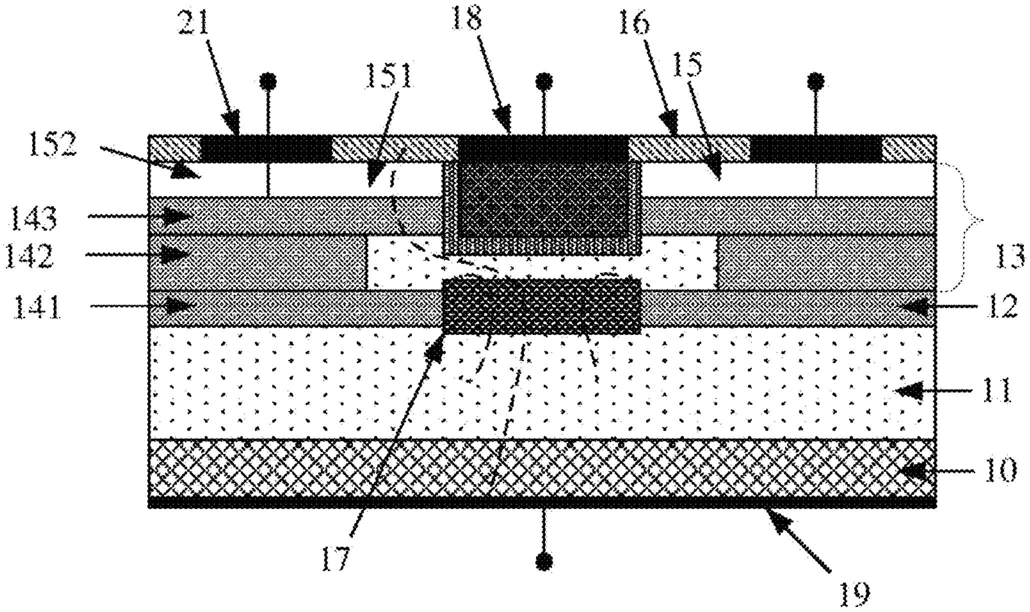
FIG. 12 is a schematic diagram of a main current path of the silicon carbide semiconductor device shown in FIG. 10 at the turn-on moment.
Figure 13:
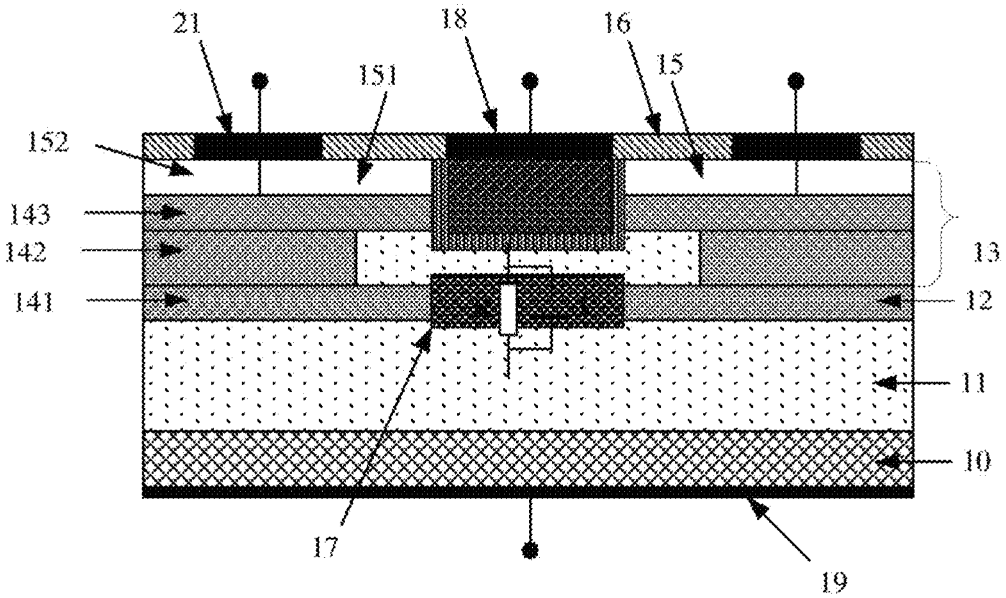
FIG. 13 is a schematic diagram of an equivalent parasitic parameter of the silicon carbide semiconductor device shown in FIG. 12.

As shown in FIG. 12, FIG. 12 is a schematic diagram of a main current path of the silicon carbide semiconductor device shown in FIG. 10 at the turn-on moment. A current path is formed between the source electrode and the drain electrode. A middle dotted curve shown in FIG. 12 represents the current path. The current passes through the JFET structure formed based on the doping region 17. Due to the rapid change of the current, a high-frequency spike voltage is generated in the circuit. Meanwhile, due to the rapid change of the voltage on the current path, the depletion regions (regions between the left and right dotted curves in FIG. 12) of the JFET structure will expand or contract rapidly corresponding to different voltage changes. The JFET structure is now equivalent to a parallel structure of a variable resistor R and a junction capacitor C. As shown in FIG. 13, FIG. 13 is a schematic diagram of an equivalent parasitic parameter of the silicon carbide semiconductor device shown in FIG. 12.

Through the specific circuit application and device electrical model simulation, the appropriate thickness d and doping concentration of the second epitaxial layer 12, the graphic design of the ion injection structure of the doping region 17, and the concentration and graphic outline design are selected to be optimized and adjusted, so that an appropriate parasitic parameter value (the required variable resistor R and one junction capacitor C) can be obtained. During actual application to the circuit modules with different on-off frequencies, the effective voltage spike suppression effect can be achieved, and the turn-on loss can be reduced.

In the embodiment of the present application, the silicon carbide semiconductor device is described by only a single cell structure. Apparently, when the semiconductor device is manufactured, a plurality of cell structure can be manufactured at the same time based on a wafer-level process, and then the wafer is divided to form the silicon carbide semiconductor device. The silicon carbide semiconductor device has a plurality of cell structures.

Figure 14:
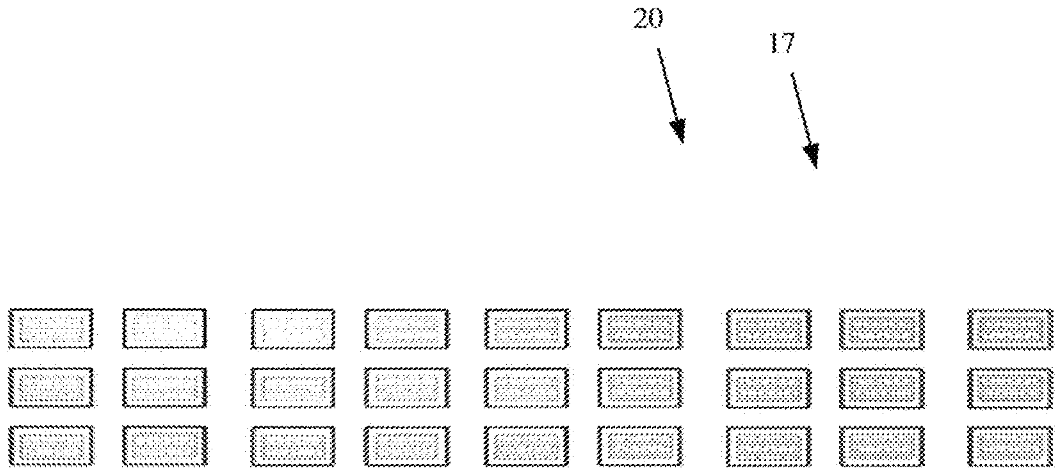
FIG. 14 is a layout of a silicon carbide semiconductor device provided by an embodiment of the present application in groove design and doping region ion injection area.

As shown in FIG. 14, FIG. 14 is a layout of a silicon carbide semiconductor device provided by an embodiment of the present application in groove design and doping region ion injection area. The injection window of the doping region 17 is located in the groove 20. The channel characteristic of the JFET structure can be adjusted by the graphic design of the doping region 17, the ion injection concentration and the graphic outline design. The area of the injection window of the doping region 17 may be less than or equal to the area of the groove 20.

Each embodiment of the present specification is described in a progressive manner, or a parallel manner or a progressive and parallel combined manner, each embodiment focuses on the difference from other embodiments, and the same and similar parts between the embodiments may refer to each other.

It should be noted that in the description of the present application, it should be understood that orientation or position relationships indicated by terms “upper”, “lower”, “top”, “bottom”, “inner”, “outer” and the like are orientation or position relationships based on the accompanying drawings, which is only for facilitating description of the present application and simplifying description, and not intended to indicate or imply that the referred device or component must have a specific orientation and be constructed and operated in the specific orientation. Therefore, it cannot be interpreted as a limitation to the present application. When one component is considered to be “connected” to another component, the component may be directly connected to another component or there may be a centered component.

It should be further noted that in this specification, relational terms such as first and second are only used to differentiate one entity or operation from another entity or operation, and do not necessarily require or imply that any actual relation or sequence exists between these entities or operations. Besides, the terms “comprise”, “include” or any other variants thereof are intended to cover non-exclusive inclusions, so that an article or a device including a series of elements not only includes those elements, but also includes other elements not explicitly listed, or also includes elements inherent to such article or device. Without more restrictions, an element defined by the phrase “including a . . . ” does not exclude the presence of another same element in an article, or a device that includes the element.

The above illustration of the disclosed embodiments enables those skilled in the art to be able to implement or use the present application. Various modifications to these embodiments are readily apparent to those skilled in the art, and the generic principles defined herein may be implemented in other embodiments without departing from the spirit or scope of the present application. Thus, the present application will not be limited to the embodiments shown herein, but falls within the widest scope consistent with the principles and novel features disclosed herein.

What is claimed is:

1. A manufacturing method for a silicon carbide semiconductor device, comprising:

providing an epitaxial wafer, wherein the epitaxial wafer comprises: a semiconductor substrate, a first epitaxial layer arranged on a surface of the semiconductor substrate, a second epitaxial layer arranged on a surface of one side of the first epitaxial layer that is away from the semiconductor substrate, and a third epitaxial layer arranged on a surface of one side of the second epitaxial layer that is away from the first epitaxial layer;

forming a well region, a source region and a groove in the third epitaxial layer;

performing ion injection in the second epitaxial layer based on the groove to form a doping region inverted from the second epitaxial layer, wherein the doping region penetrates through the second epitaxial layer; and forming a gate electrode in the groove.

2. The manufacturing method according to claim 1, wherein the second epitaxial layer has a to-be-injected region and a first layer of well region surrounding the to-be-injected region; and forming a well region, a source region and a groove in the third epitaxial layer comprises:

sequentially forming a second layer of well region, a third layer of well region and the source region in the third epitaxial layer through ion injection, the second layer of well region being located between the first layer of well region and the third layer of well region, and the source region being located on one side of the third layer of well region that is away from the second layer of well region; and forming the groove in a surface of one side of the third epitaxial layer that is away from the second epitaxial layer, the bottom of the groove being located between the second epitaxial layer and the third layer of well region, wherein the source region and the third layer of well region are both in contact with a side wall of the groove, and there is a distance between the second layer of well region and the side wall of the groove.

3. The manufacturing method according to claim 1, wherein a manufacturing method for the epitaxial wafer comprises:

sequentially performing epitaxy on the surface of the semiconductor substrate to form the first epitaxial layer, the second epitaxial layer and the third epitaxial layer, wherein the first epitaxial layer has the same doping type as the third epitaxial layer, and the first epitaxial layer and the second epitaxial layer perform inversed doping.

4. The manufacturing method according to claim 1, wherein the manufacturing method further comprises:

forming a metal source electrode connected to the source region; and forming a metal drain electrode on a surface of one side of the semiconductor substrate that is away from the first epitaxial layer.

* * * * *